United States Patent [19]

Macklin et al.

[11] 4,411,733
[45] Oct. 25, 1983

[54] SPER DEVICE FOR MATERIAL WORKING

[75] Inventors: John J. Macklin, Highlands; William T. Silfvast, Holmdel, both of N.J.; Obert R. Wood, II, New York, N.Y.

[73] Assignee: Bell Telephone Laboratories, Incorporated, Murray Hill, N.J.

[21] Appl. No.: 389,780

[22] Filed: Jun. 18, 1982

[51] Int. Cl.³ .................... H01L 21/306; C23F 1/00; B05D 3/06; B05B 5/02

[52] U.S. Cl. .................... 156/643; 118/620; 118/715; 156/646; 156/656; 156/345; 204/192 R; 204/192 E; 204/298; 372/62; 427/38

[58] Field of Search .................... 427/38, 39, 399; 118/715, 728, 620, 624; 204/164, 192 R, 192 EC, 192 E, 298; 156/345, 643, 646, 656, 657; 372/62, 87, 81

[56] References Cited

U.S. PATENT DOCUMENTS

| | | | |
|---|---|---|---|
| 3,479,269 | 11/1969 | Byrnes et al. | 204/298 X |
| 4,123,316 | 10/1978 | Tsuchimoto | 204/298 X |
| 4,201,645 | 5/1980 | Riegert | 204/298 X |
| 4,336,506 | 6/1982 | Silfvast et al. | 372/62 |

OTHER PUBLICATIONS

Thin Film Technology by Robert W. Berry et al., 1968, pp. 3-11, 156-157 and 204-208.

*Primary Examiner*—William A. Powell
*Attorney, Agent, or Firm*—Michael J. Urbano

[57] ABSTRACT

A segmented plasma excitation and recombination (SPER) device is employed in a deposition scheme in which the plasma generated in the gap between adjacent electrodes is formed into a beam of ions/atoms by flowing a background gas through the gap. The beam strikes a workpiece and deposits a layer of the vaporized electrode material thereon. Also described are techniques where the ions react with workpiece or the background gas to form a layer, as well as where the ions bombard the workpiece to etch away a layer.

12 Claims, 1 Drawing Figure

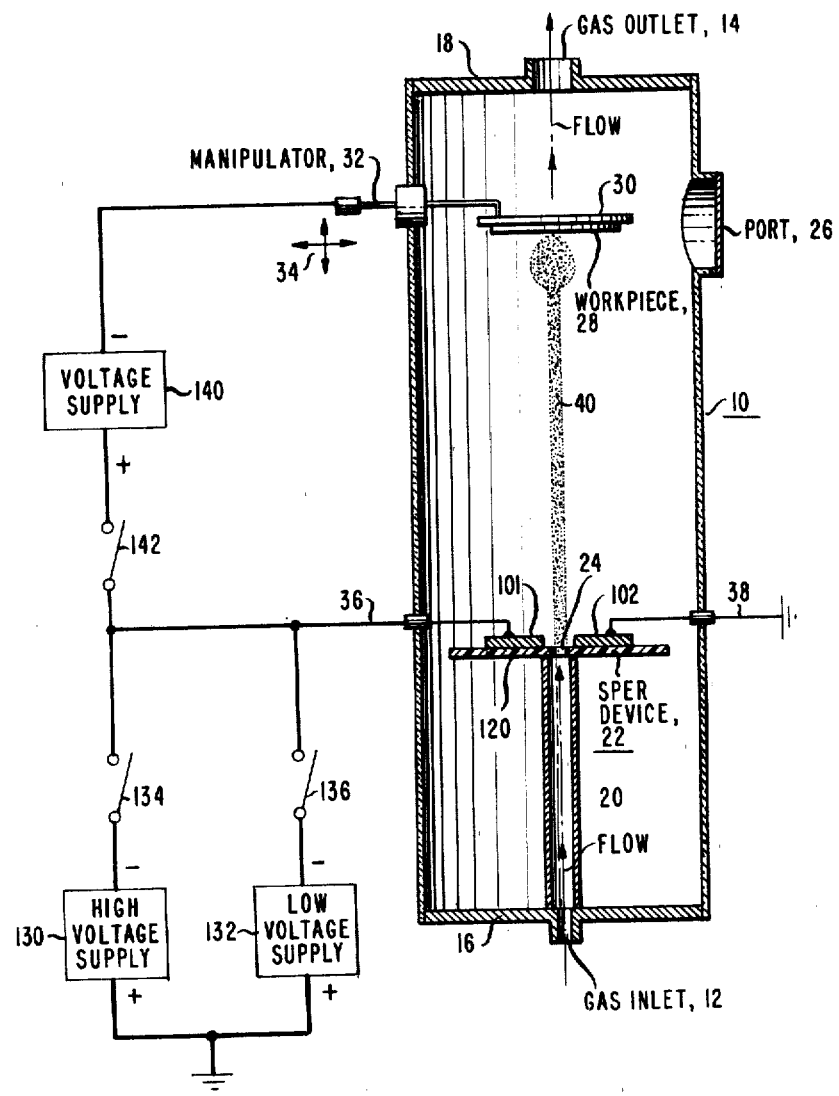

SPER DEVICE FOR MATERIAL WORKING

CROSS-REFERENCE TO RELATED APPLICATIONS

This application is being concurrently filed with application Ser. No. 389,779 entitled "CONTINUOUS WAVE SPER LASER" by J. J. Macklin, W. T. Silfvast and O. R. Wood II.

BACKGROUND OF THE INVENTION

This invention relates to techniques for material working including material deposition, reaction, and etching.

Techniques for metal deposition span nearly two centuries of scientific exploration beginning with the discovery of gold electroplating in the early nineteenth century to recent demonstrations of single crystal aluminum growth utilizing molecular beam epitaxy. Many of these techniques are described in a book entitled, *Thin Film Technology*, D. Van Nostrand Company, Inc., Princeton, N.J. (1968) by R. W. Berry, et al. They categorize metal deposition techniques into three broad categories:

(1) Chemical processes such as electrodeposition, chemical reduction, electroplating, and chemical vapor plating;

(2) Evaporation which is accomplished by using vacuum pumps to reduce the pressure inside a deposition chamber and then heating the metal to be evaporated in a filament or boat made of a high-melting point material. The heat is supplied typically by resistant heating, radio frequency induction, or electron bombardment. Molecular beam epitaxy deposition, mentioned above, falls within this genus; and (3) Cathode sputtering which is similar to evaporation in that a partial vacuum is required but is dissimilar in that thermal energy is used in evaporation, whereas ion bombardment of the metal, causing ejection of electrons, is used for sputtering.

Both evaporation and sputtering have been practiced in the presence of a glow discharge as described by Berry et al., supra, pages 156-157 and 204-208. This variant of the evaporation technique has been termed "ion plating." Briefly, it entails establishing a glow discharge region between an evaporator filament and a cathode substrate. As the vapor atoms pass through the glow discharge, some are ionized and are accelerated to the substrate where metal deposition takes place.

Each of these prior art techniques, however, suffers from one or more of the following disadvantages: inefficiency in that relatively high currents produced slow deposition rates and thereby increase both processing time and the likelihood of contamination; the need for maintaining relatively high vacuums and the concomitant cost of equipment to do so; lack of precise control as to deposition time (hence layer thickness) and deposition direction (hence layer patterning); contamination when chemical solutions contact the workpiece or from boats used to carry the evaporant; and difficulty in depositing relatively high-melting point (low vapor pressure) metals.

SUMMARY OF THE INVENTION

In the course of our experiments with segmented plasma excitation and recombination (SPER) lasers, we discovered that the plasma of metal ions generated in the gap between adjacent electrodes can be utilized to deposit a metal layer or coating on a workpiece. In a preferred embodiment, a background gas is rapidly flowed through an aperture in the gap so as to carry the plasma downstream, away from the electrodes. The plasma forms a collimated beam which strikes the workpiece and deposits a metal layer thereon. This technique is also applicable to the deposition of nonmetallic layers, for example semiconductor layers, provided that the requisite plasma can be generated.

Due to the relatively low currents required to generate the plasma, our invention has the advantage of being able to efficiently deposit metal layers at reasonably high rates, thereby decreasing processing time and the likelihood of contamination. Because that current can readily be turned on and off in short periods of time, abrupt transitions can be made to precisely control layer thickness. Further control, in the form of directionality, arises from the fact that the beam-shaped plasma permits localized deposition. In addition, our technique does not require a high vacuum and is compatible with the deposition of relatively high-melting point materials such as copper and aluminum.

Furthermore, our invention is not merely applicable to material deposition; that is, a layer can be formed on the workpiece not only by deposition but also by reaction of the beam with the workpiece or with the background gas. Moreover, a surface layer can be removed from the workpiece by utilizing an electric field to accelerate the ions toward the workpiece. These ions bombard the workpiece and thereby etch away the surface layer.

BRIEF DESCRIPTION OF THE DRAWING

Our invention, together with its various features and advantages, can be readily understood from the following more detailed description taken in conjunction with the accompanying FIGURE of the drawing, in which the sole figure is a schematic of a SPER device and associated apparatus used in practicing our invention.

DETAILED DESCRIPTION

With reference now th the FIGURE, there is shown a chamber 10 having a relatively narrow gas inlet 12 in one endplate 16 and a wider gas outlet 14 in the opposite endplate 18. Typically inlet 12 is connected to a source of background gas (e.g., He, not shown) and outlet 14 is connected to a pump (also not shown). Gas introduced through inlet 12 flows through a narrow pipe 20 to an aperture 24 in a SPER device 22. A port 26 allows a workpiece 28, mounted on a holder 30, to be positioned in the chamber 10. The position of the workpiece is controlled by a manipulator 32 shown schematically as a mechanical device capable of both vertical and horizontal motion as shown by arrows 34. When a suitable electrical signal is applied across leads 36 and 38, SPER device 28 generates an ion plasma from vaporized material of its electrodes 101-102. This plasma takes the shape of a beam 40 which strikes workpiece 28 and deposits a layer of the vaporized material thereon.

SPER device 22 is of the type described in four copending applications, all of which are assigned to the assignee hereof: Ser. No. 82,308 filed on Oct. 5, 1979 (W. T. Silfvast et al., now U.S. Pat. No. 4,336,506; Ser. No. 367,216 filed on Apr. 9, 1982 (J. J. Macklin et al.); Ser. No. 367,092 filed on Apr. 9, 1982 (W. T. Silfvast et al.); and Ser. No. 389,779 concurrently filed herewith (J. J. Macklin et al.). These applications are incorporated by reference herein. SPER device 22 comprises at least two strip electrodes 101-102 positioned in tandem on an electrically insulating substrate 120 in such a manner as to leave a small gap between adjacent strips. This gap provides a discharge path between the strips when a suitable electrical signal is applied thereto. Aperture 24 is formed in the gap. This electrode arrangement is mounted in chamber 10. A high voltage supply 130 and a low voltage supply 132 are connectable in series across the electrodes via switches 134 and 136, respectively. The high voltage supply typically provides a high power pulse (e.g., a few kV at 20-50 mA for ~1 msec) to pre-ionize the gap, after which low voltage supply 132 provides a lower power signal suitable for longer duration operation (e.g., 20 V D.C. at 3-6 A for ~1 sec). A technique for eliminating the high voltage supply 130 and operating with low voltage supply 132 only is described in our application to be filed. For still longer duration operation, well-known cooling means (not shown) should be incorporated to prevent the electrodes from overheating and melting. This excitation produces a bright ion plasma of vaporized electrode material in the gap. The background gas flowing through aperture 24 causes this plasma to take the shape of collimated beam 40 which strikes workpiece 28. Of course, the flowrate of the gas (e.g., 500 l/min) and the size of the aperture (e.g., a 0.25 mm diameter hole) determine the shape and length of beam 40.

The entirety of each strip need not constitute a material which is vaporizable into a plasma. As described in our copending applications Ser. Nos. 367,092 and 367,216, it is sufficient if the cathode ends constitute such a material and that the anode ends constitute a nonvaporizable material under the operating condition of the device. Although the vaporizable material typically comprises a metal, other materials such as semiconductors are also suitable. Moreover, strips of different vaporizable materials can be mixed within a single device so as to yield a plasma comprising ions of more than one material. In this fashion a composite layer (e.g., an amalgam, alloy, or crystal) can be deposited on workpiece 28. To this end it may be desirable to heat the workpiece so that deposition takes place at an elevated temperature rather than at room temperature.

The composition of the beam (i.e., the ratio of ionized species to neutral species in the plasma) is a function of distance from the gap. At points farther away from the gap (toward the workpiece) the ratio decreases, being illustratively about 30:1 at 1-2 cm from the gap and lower at, say, 7-8 cm. At these larger distances some of the neutral species may even form clusters. Thus, by varying the distance between SPER device 22 and workpiece 28 it is possible to vary the character of the deposited layer. For example, for metal deposition it is possible to form a soot-like layer as well as a more metallic-like layer. This feature may be of particular importance in the fabrication of optical disc or video disc recording media. In addition, it should be noted that the beam composition can be controlled to varying degrees with other parameters (e.g., gas pressure in chamber 10 or in nozzle 24).

As discussed in the aforementioned copending applications, ion plasmas have been generated in SPER devices utilizing a variety of electrode materials including, for example, Ag, Bi, C, Ca, Cd, Cu, In, Mg, Pb, Sn, Zn, Li, Al, and Ni.

EXAMPLE

This example describes the deposition of a metal layer on an insulating workpiece. Materials, dimensions, as well as other device parameters, and operating conditions are provided by way of illustrations only and, unless otherwise stated, are not intended to limit the scope of our invention.

A Cd rod (0.75 in. long by 10 mm diameter) was spherically shaped at one end and then cut along the axis of the rod to form two electrodes 101 and 102. These electrodes were mounted on a glass substrate 120 with their axes aligned. The hemispherical ends of the electrodes faced one another and were separated by a 2.5 mm gap. A 0.25 mm diameter hole was drilled in the gap to form aperture 24, which acted as a nozzle for He gas flowing in conduit 20. The workpiece 28 was a glass slide and was positioned between 1 and 8 cm from SPER device 22.

In operation, high voltage supply 130 provided a few kV at 20-50 mA for ~1 msec to pre-ionize the gap, and then lower voltage supply 132 provided about 20 V D.C. at about 3-6 A for 0.25-0.50 sec. With even this relatively low current level we were able to deposit 1000-2000 Å thick Cd layers on the glass slide. This deposition was equivalent to about $10^{-3}$ g/cm$^2$/sec. With higher currents, we expect that considerably faster deposition rates are possible.

It is to be understood that the above-described arrangements are merely illustrative of the many possible specific embodiments which can be devised to represent application of the principles of the invention. Numerous and varied other arrangements can be devised in accordance with these principles by those skilled in the art without departing from the spirit and scope of the invention. In particular, the fact that our invention generates ions (rather than neutral species as in evaporation processes) implies that it may be possible to react two or more ions on the surface of a workpiece or even to react an ion with the workpiece itself (e.g., if the ion were a metal and the workpiece a semiconductor). Moreover, it may be possible to react the ions with the background gas to deposit compounds on the workpiece (e.g., use of Si electrodes and H$_2$ gas may make it possible to deposit hydrogenated polysilicon). Alternatively, the ions could be employed to etch the workpiece by employing an electric field to accelerate the ions toward the workpiece. The accelerated ions are thus provided with sufficient energy to effect etching. In this case, because the ions are positively charged, a voltage supply 140 is connected (via switch 142) across the workpiece 28 and SPER device 22 to place the former at a more negative potential with respect to the latter. In addition, selective etching of the workpiece can be realized by writing thereon with an electron beam. The electrons being negatively charged attract the positive ions in the beam causing etching to occur preferentially in the regions where the electron beam strikes the workpiece. Finally, because the beam 40 contains ions, conventional electric or magnetic field deflection techniques can be used to scan or focus the ions in the beam.

What is claimed is:

1. Apparatus for forming a layer of material on a workpiece comprising:
   at least two strips having at least one gap which provides an intervening discharge path;
   means for applying an electrical signal to said at least two strips;

at least a portion of said at least two strips being fabricated from said material which is converted into an ion plasma as the result of the application of said signal; and means for flowing gas through said gap, thereby to cause said plasma to take the shape of a beam which strikes said workpiece and forms said layer thereon.

2. The apparatus of claim 1 wherein said applying means is adapted to apply a direct current electrical signal to said strips.

3. The apparatus of claim 1 further including
a substrate on which said strips are mounted,
said substrate having an aperture aligned with said gap, and
said flowing means is adapted to cause said gas to flow through said aperture to form said beam.

4. The apparatus of claim 3 further including
a gas chamber in which said strips, said substrate and said workpiece are mounted, said chamber having a gas inlet at one end proximate said substrate and said strips, and having a gas outlet proximate said workpiece, and
a conduit for carrying gas from said inlet to said aperture in said substrate.

5. The apparatus of claim 1 wherein said material comprises a metal.

6. A method of forming a layer of material on a workpiece comprising the steps of:
generating an ion vapor plasma of said material in the gap of a SPER device, and
flowing gas through said gap so as to cause said plasma to take the shape of a beam which strikes said workpiece and forms said layer thereon.

7. The method of claim 6 wherein the ions of said beam react with said workpiece to form said layer.

8. The method of claim 6 wherein the ions of said beam react with said gas to form said layer.

9. A method of etching a layer from a workpiece comprising the steps of:
generating an ion vapor plasma in the gap of a SPER device,
flowing gas through said gap so as to cause said plasma to take the shape of a beam which strikes said workpiece, and
accelerating the ions in said beam so that they strike said workpiece with sufficient energy to etch away said layer.

10. Apparatus for etching a workpiece comprising:
at least two strips having at least one gap which provides an intervening discharge path;
means for applying an electrical signal to said at least two strips;
at least a portion of said at least two strips being fabricated from a material which is converted into an ion plasma as the result of the application of said signal;
means for flowing gas through said gap, thereby to cause said plasma to take the shape of a beam which strikes said workpiece; and
means for accelerating the ions of said plasma toward said workpiece.

11. The apparatus of claim 10 wherein said ions are positively charged and said accelerating means is adapted to apply a more negative potential to said workpiece than to said strips.

12. The apparatus of claim 10 further including
a substrate on which said strips are mounted, said substrate having an aperture aligned with said gap, and said flowing means is adapted to cause said gas to flow through said aperture.

* * * * *